United States Patent
Hosoya et al.

(10) Patent No.: US 8,246,798 B2
(45) Date of Patent: Aug. 21, 2012

(54) SUBSTRATE PROCESSING APPARATUS AND APPARATUS AND METHOD OF MANUFACTURING MAGNETIC DEVICE

(75) Inventors: Hiroyuki Hosoya, Tama (JP); Koji Tsunekawa, Tokyo (JP); Yoshinori Nagamine, Tama (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/667,836

(22) PCT Filed: Mar. 2, 2009

(86) PCT No.: PCT/JP2009/053844
§ 371 (c)(1),
(2), (4) Date: Jan. 5, 2010

(87) PCT Pub. No.: WO2010/100710
PCT Pub. Date: Sep. 10, 2010

(65) Prior Publication Data
US 2011/0303527 A1    Dec. 15, 2011

(51) Int. Cl.
*C23C 14/35* (2006.01)
*C23C 16/00* (2006.01)
(52) U.S. Cl. ......... 204/298.16; 204/298.37; 204/298.23; 204/298.28; 156/345.42; 156/345.46; 156/345.49; 156/345.55; 118/723 MR; 118/723 MA; 118/723 E; 118/730
(58) Field of Classification Search ............. 204/298.16, 204/298.37, 298.23, 298.28; 156/345.42, 156/345.46, 345.49, 345.55; 118/723 MR, 118/723 MA, 723 E, 730
See application file for complete search history.

(56) References Cited

U.S. PATENT DOCUMENTS

| 6,610,180 B2 | 8/2003 | Sakai et al. ............... 204/192.12 |
| 6,616,816 B2 | 9/2003 | Sakai ......................... 204/192.1 |
| 2002/0017247 A1 | 2/2002 | Sakai et al. .................. 118/730 |
| 2002/0017910 A1 | 2/2002 | Sakai ........................... 324/750 |

FOREIGN PATENT DOCUMENTS

| JP | 61-185912 | 8/1986 |
| JP | 06-207270 | 7/1994 |
| JP | 07-173628 | 7/1995 |
| JP | 2002-043159 | 2/2002 |
| JP | 2002-050809 | 2/2002 |
| JP | 2002-053956 | 2/2002 |
| JP | 2004-091845 | 3/2004 |

*Primary Examiner* — Rodney McDonald
(74) *Attorney, Agent, or Firm* — Fitzpatrick, Cella, Harper & Scinto

(57) ABSTRACT

According to the present invention, it can be switched whether or not to apply a magnetic field to a substrate depending on a material of a film to be formed, and a magnetic layer and a non-magnetic layer can be formed in the same chamber. A sputtering apparatus 100 includes a substrate holder 102 configured to support a substrate W; magnet holders 106 that are disposed around the substrate holder; magnets 104 that are movably loaded on the magnet holders; supporting members 103 that protrude from the substrate holder so as to face the magnets; connecting members 105 that protrude from the magnets to face the substrate holder; a rotation mechanism 121 configured to rotationally move at least one of the substrate holder and the magnet holders; and a connection switching mechanism 122 configured to move, when positions of the supporting members and the connecting members are matched to each other by rotational movement of the rotation mechanism, the substrate holder upward and downward to engage the supporting members and the connecting members with each other or separate the supporting members and the connecting members from each other, and switch whether or not to apply a magnetic field to the substrate W.

4 Claims, 12 Drawing Sheets

[Fig.1]
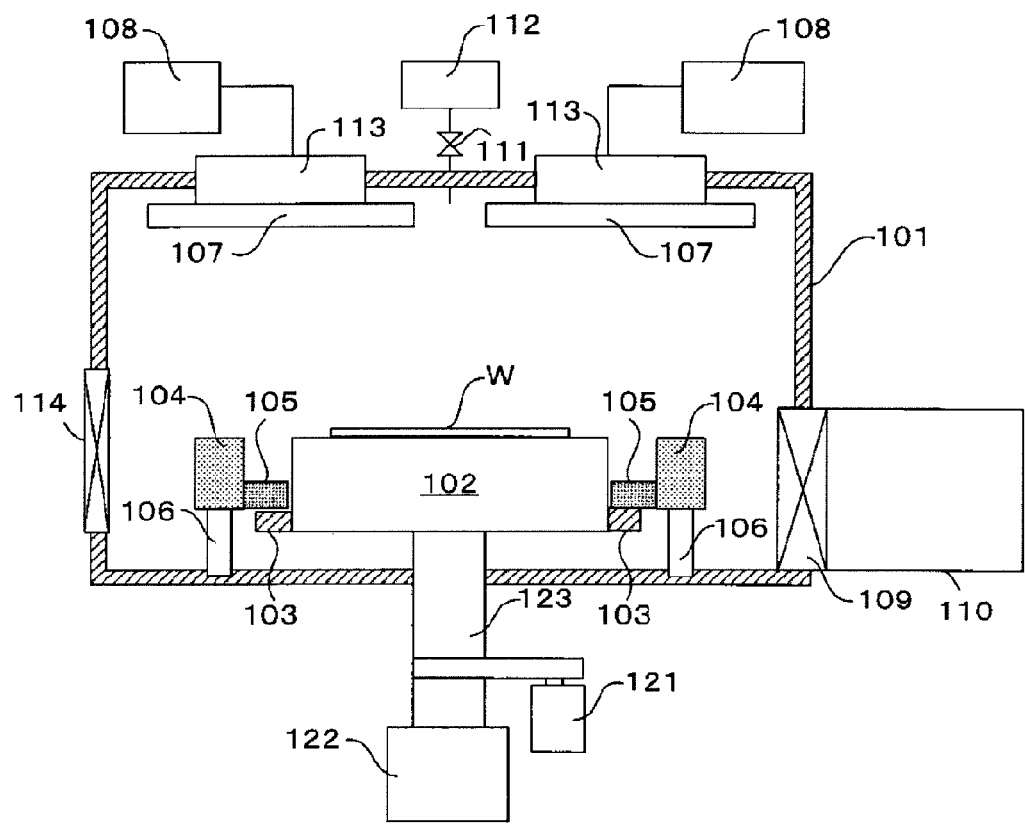

[Fig.2]
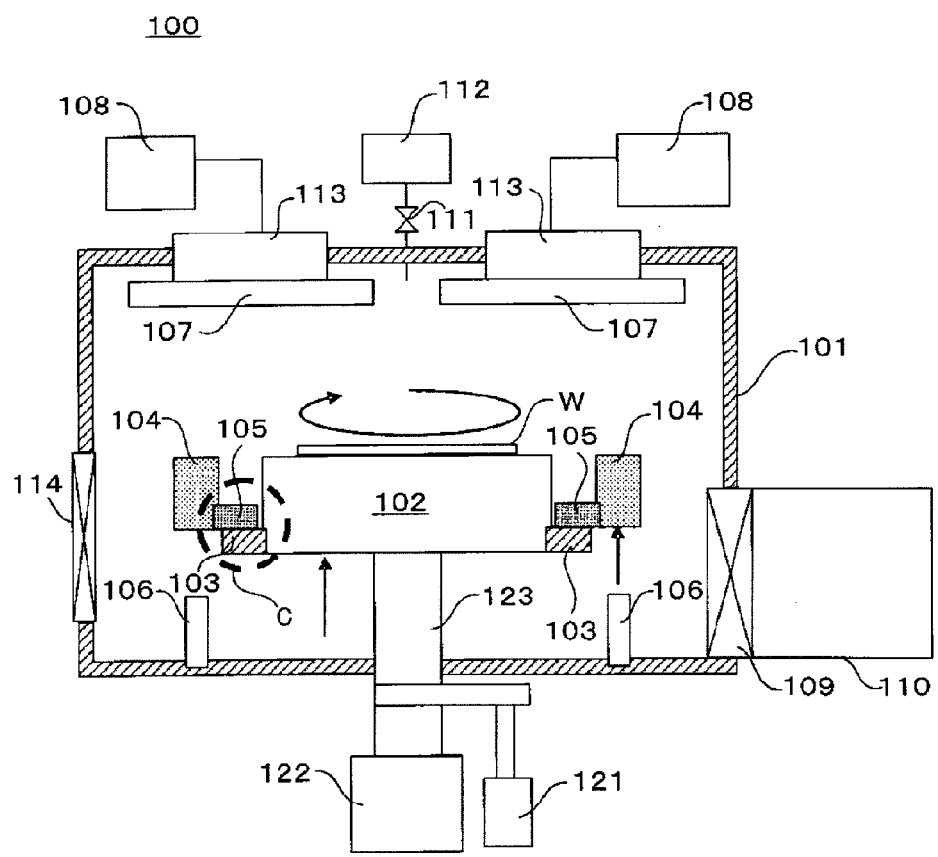

[Fig.3]
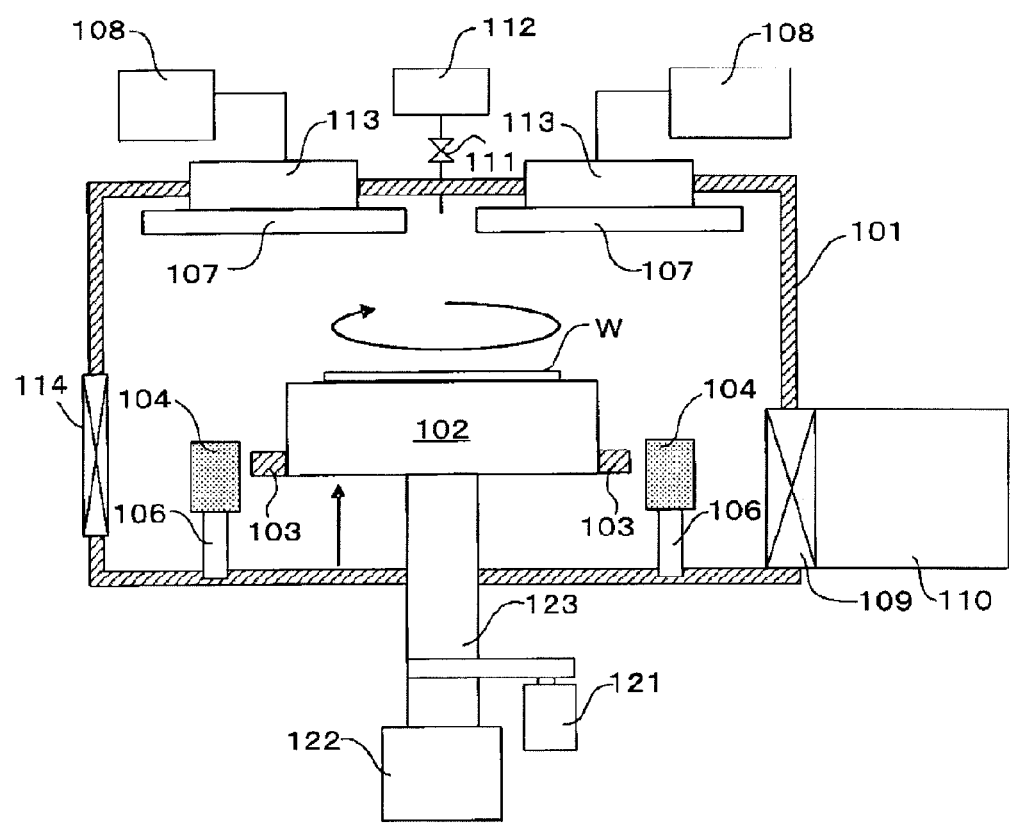

[Fig.4]
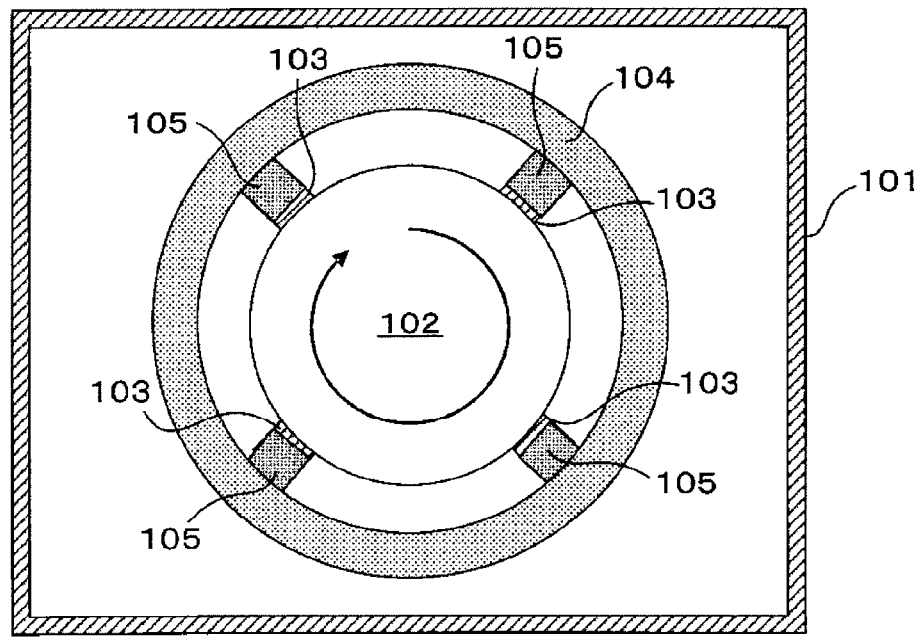

[Fig.5]
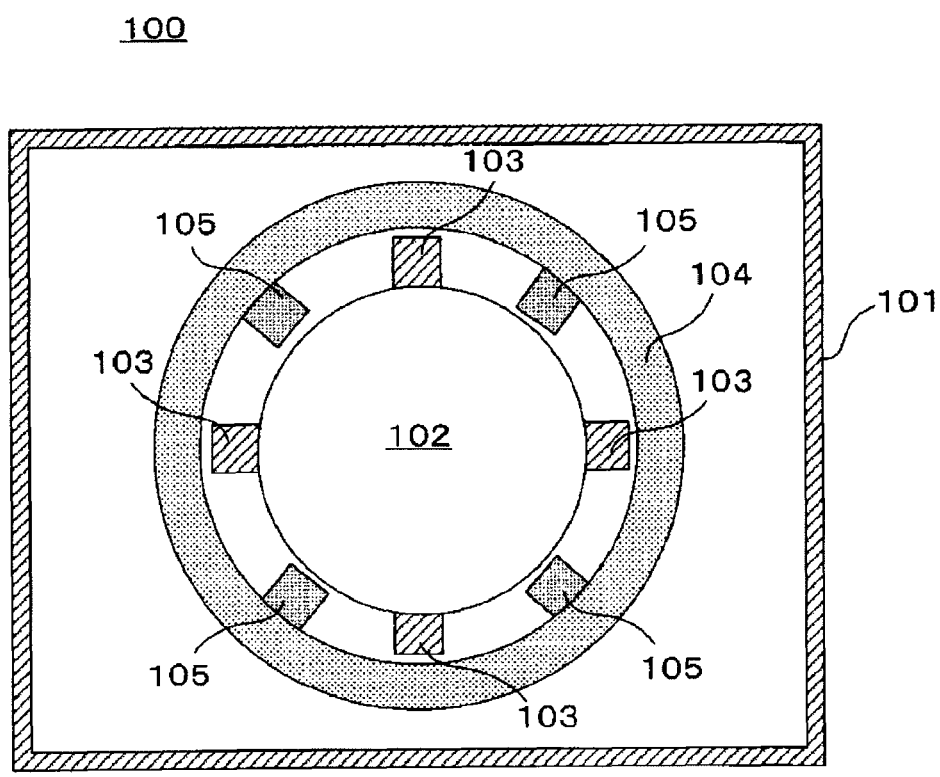

[Fig.6]
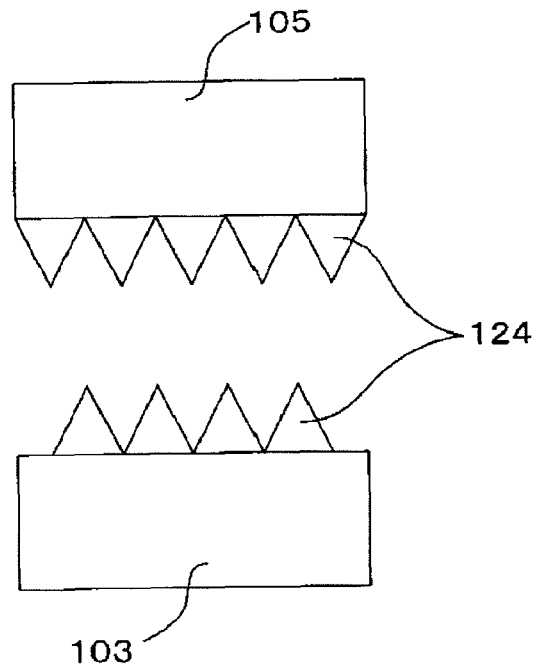
[Fig.7]
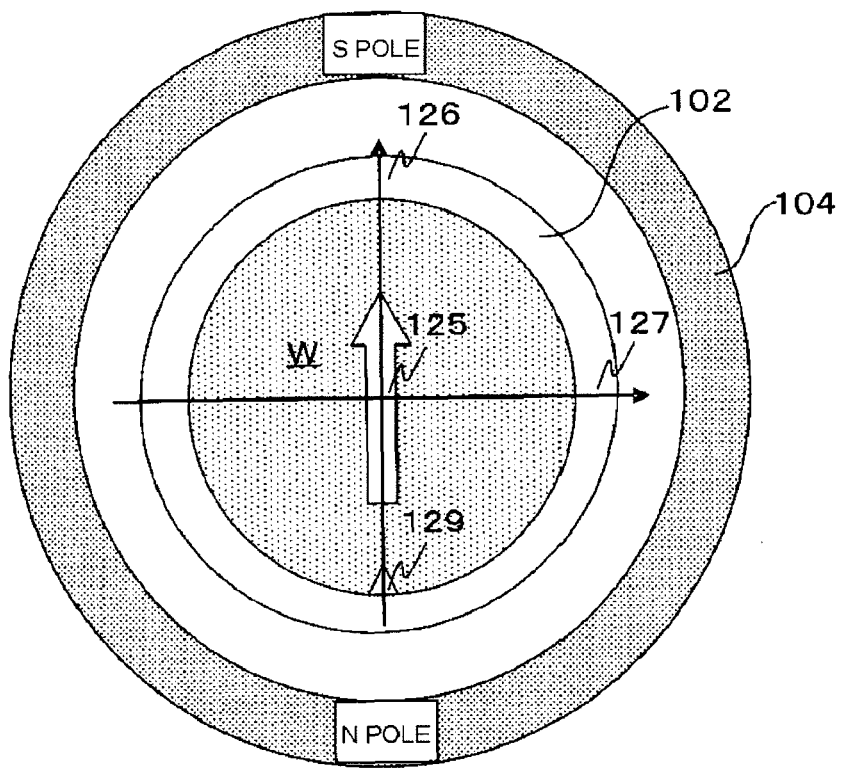

[Fig.8]
(a)
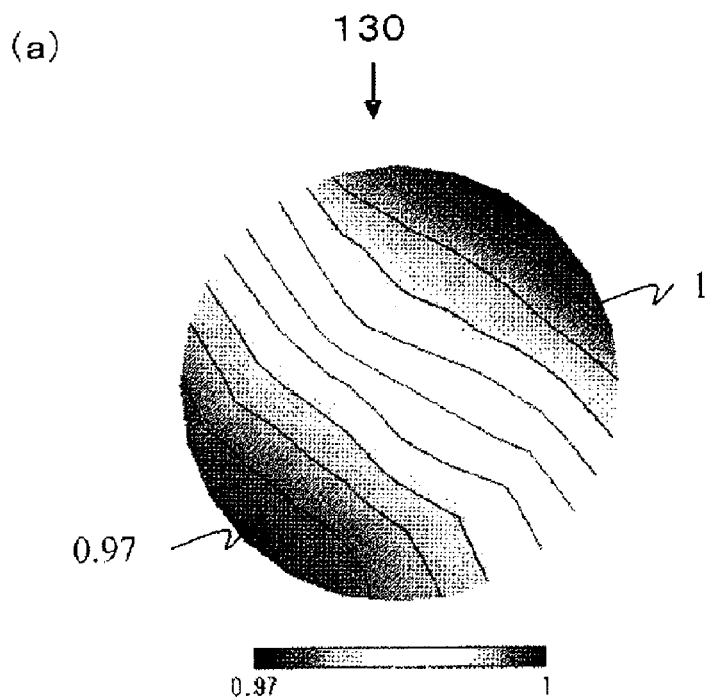
(b)
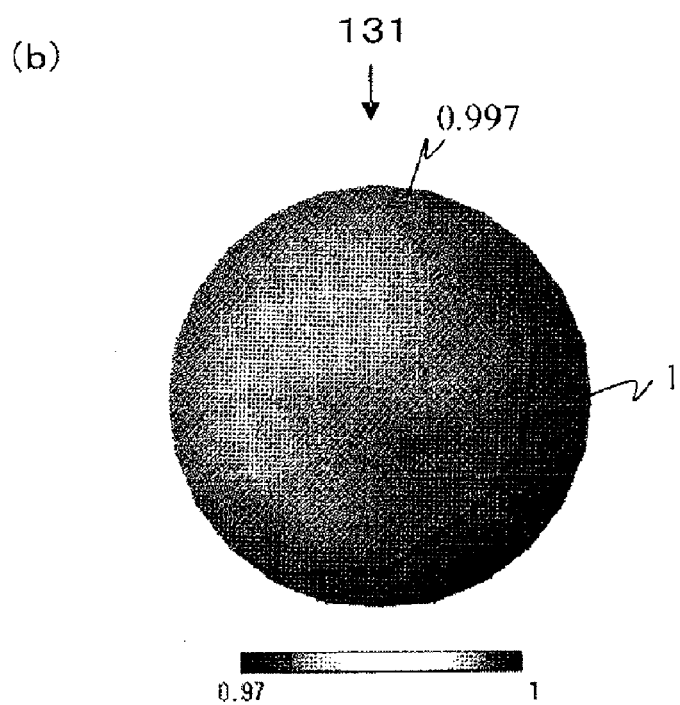

[Fig.9]
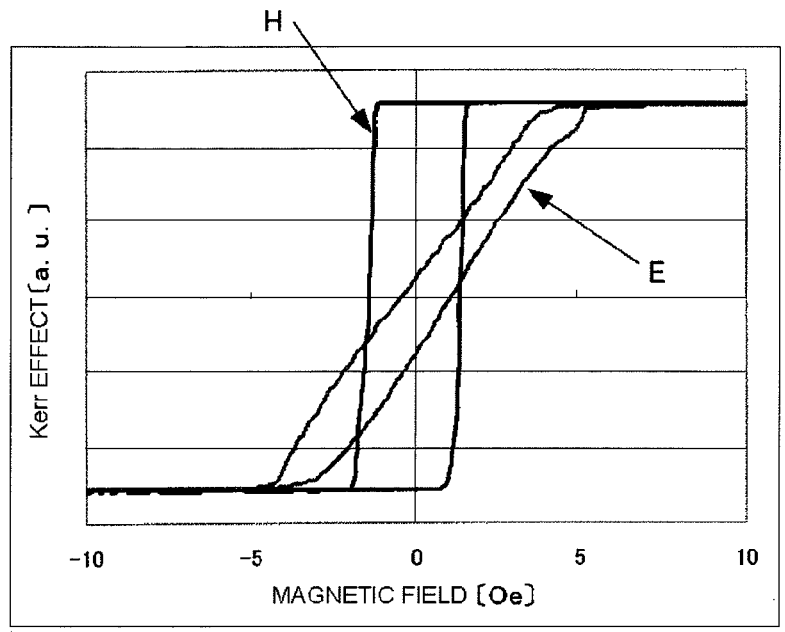
[Fig.10]
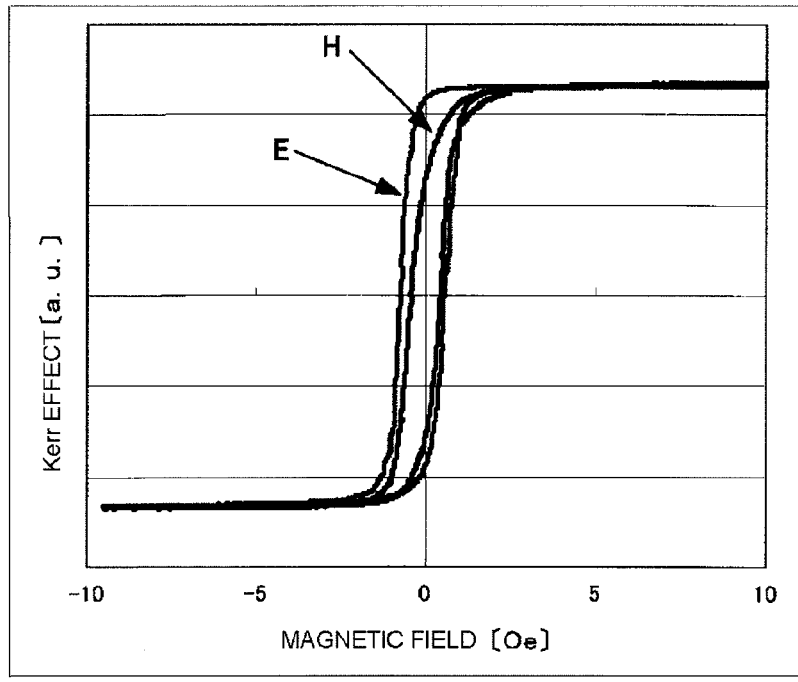

[Fig.11]
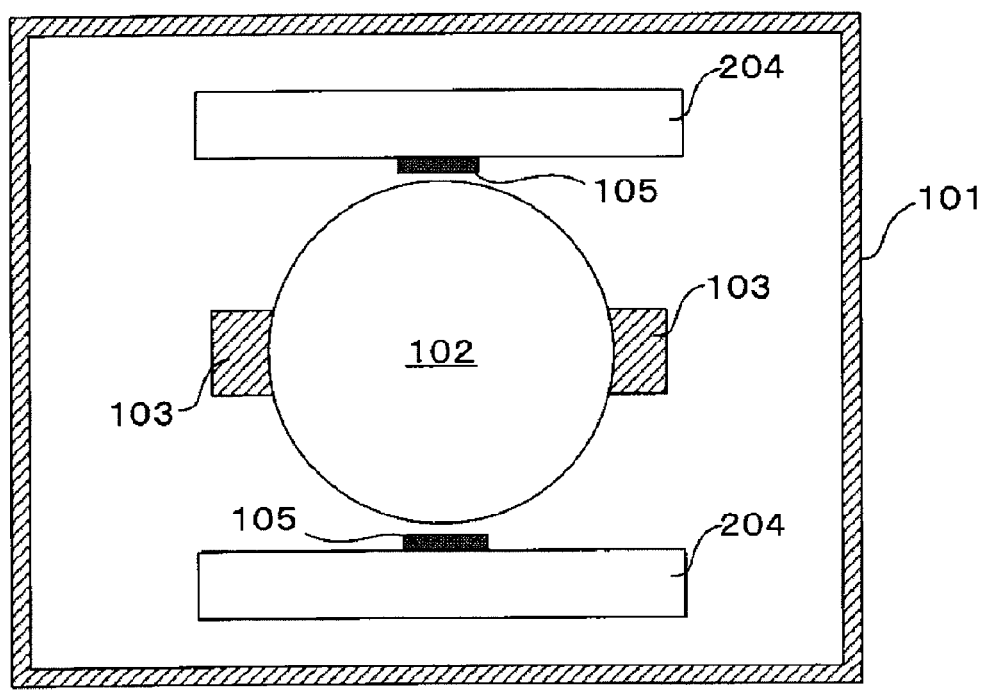

[Fig.12]
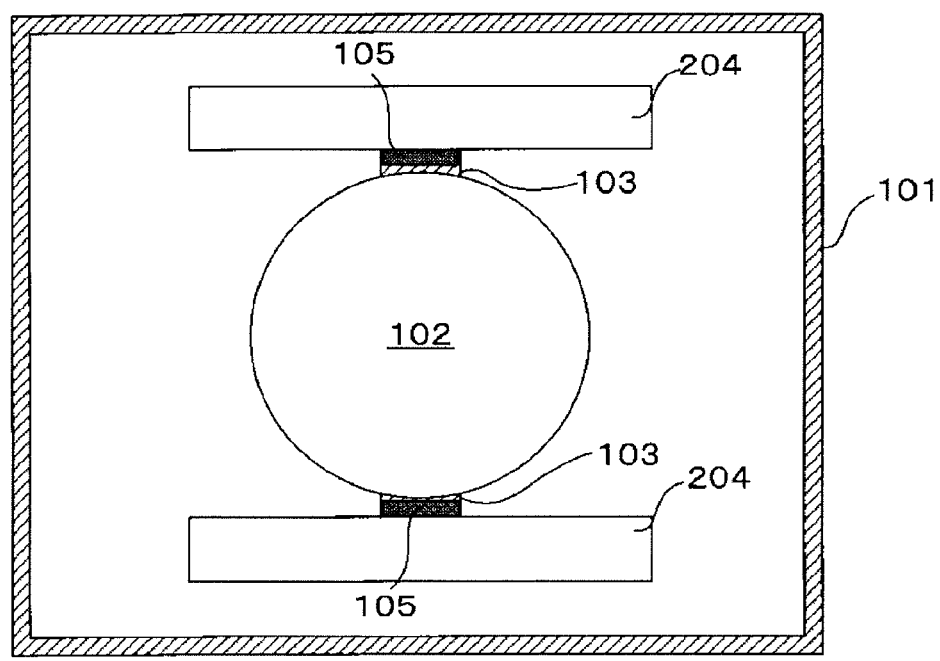

[Fig.13]
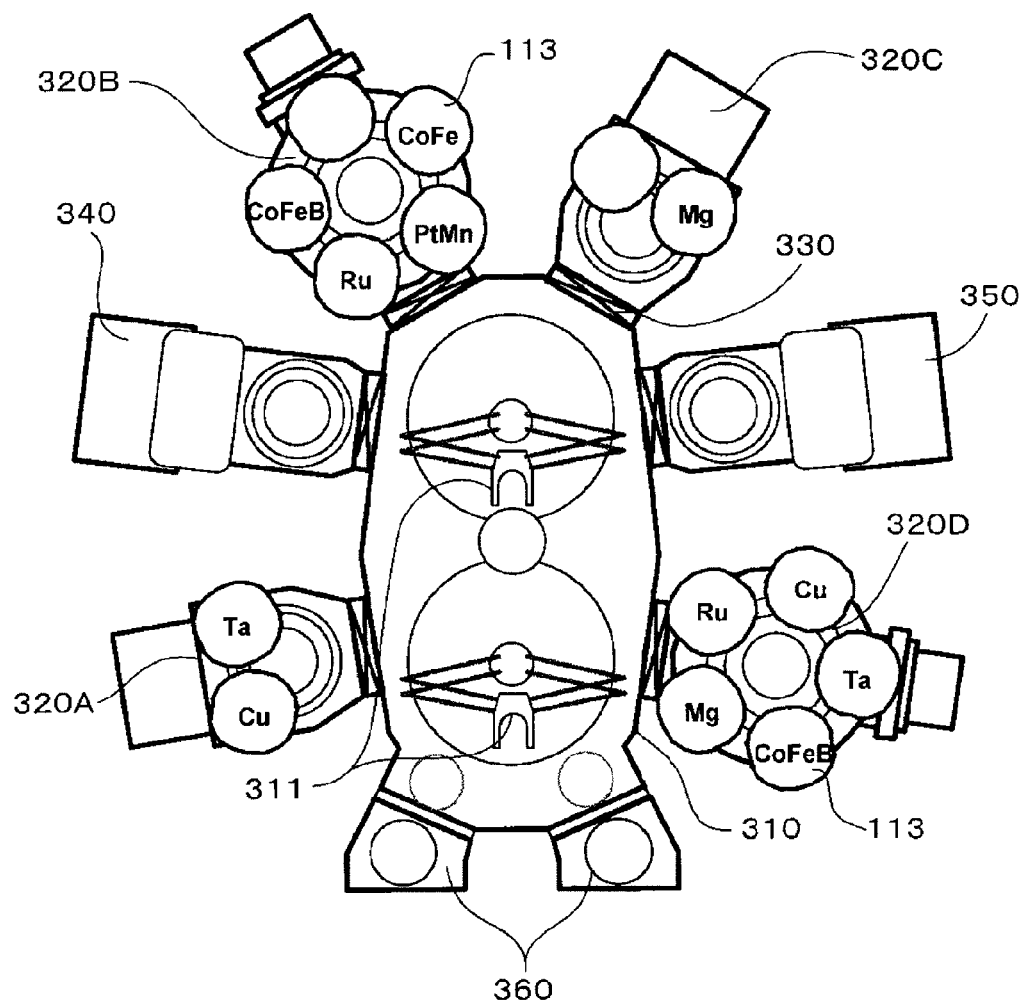

[Fig.14]
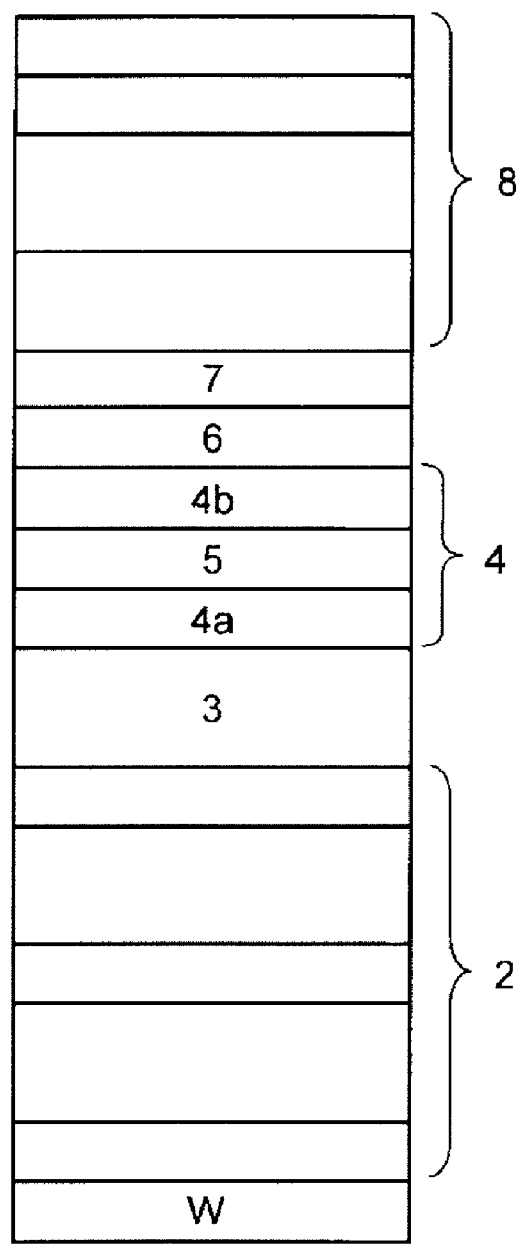

SUBSTRATE PROCESSING APPARATUS AND APPARATUS AND METHOD OF MANUFACTURING MAGNETIC DEVICE

TECHNICAL FIELD

The present invention relates to a sputtering apparatus that forms a multilayer film having a magnetic layer and a non-magnetic layer in the same reaction container, and an apparatus and method of manufacturing a magnetic device using the sputtering apparatus.

BACKGROUND ART

When a magnetic layer is formed using a sputtering method, uniaxial magnetic anisotropy is applied in order to align a magnetization direction of the magnetic layer. As a method of applying the uniaxial magnetic anisotropy to the magnetic layer, for example, a film forming method using a magnetic field has been generally used, in which a permanent magnet is fixed on a peripheral portion of a substrate, and a magnetic field whose direction is aligned to one direction parallel to a substrate surface is applied, thereby forming a magnetic layer by sputtering.

However, when a non-magnetic layer included in a multi-layer film is formed, a magnetic field does not need to be applied. Since a plasma shape varies in a film formed by sputtering due to an influence of an external magnetic field, a film thickness distribution is deteriorated, if a magnetic field is applied to a substrate by a magnet when the magnetic field does not need to be applied.

As a technique associated with the film forming method using the magnetic field, a magnetic film forming apparatus in which two permanent magnets are fixed around a substrate, auxiliary magnets are fixed on both ends of the permanent magnets, and a magnetic field is applied to the substrate in a constant direction has been suggested (for example, refer to Patent Document 1).

Further, there has been suggested a substrate processing apparatus in which a rotation mechanism of a magnet and a rotation mechanism of a substrate holder are independently provided, and a mechanism is provided to rotate by aligning a direction of a substrate and a direction of a magnetic field within a predetermined angle by means of a detecting unit of a magnetic field direction and a detecting unit of a substrate direction (for example, refer to Patent Document 2).

Furthermore, a magnetic film forming apparatus has been suggested, in which an easy-axis imparting magnetic field generating device which, when a film is formed, applies a magnetic field to a peripheral portion of a substrate surface in a specific direction and imparts an easily magnetized property only in the specific direction is provided, and a rotation mechanism rotates the easy-axis imparting magnetic field generating device integrally with the substrate (for example, refer to Patent Document 3).

[Patent Document 1] Japanese Patent Application Laid-Open No. 06-207270
[Patent Document 2] Japanese Patent Application Laid-Open No. 2002-53956
[Patent Document 3] Japanese Patent Application Laid-Open No. 2002-43159

DISCLOSURE OF THE INVENTION

Problems to be Solved by the Invention

Meanwhile, according to the technique disclosed in Patent Document 1, since the permanent magnet is fixed on the substrate holder, the magnetic field may be applied to the substrate, even when the non-magnetic film to which no magnetic field needs to be applied is formed.

Further, according to the technique disclosed in Patent Document 2, the magnet and the substrate holder are independently provided with the rotation mechanisms, and the magnetic field can be applied to the substrate in an arbitrary direction. However, when the magnetic field does not need to be applied, the magnetic field cannot be cut.

Furthermore, according to the technique disclosed in Patent Document 3, since an electromagnet is used as the magnet, the magnetic field can be cut according to necessity. However, since a power line and a cooling water line should be introduced, the size of the apparatus is increased, which results in increase in a manufacturing cost.

Accordingly, it is an object of the present invention to provide a sputtering apparatus that can switch whether or not to apply a magnetic field to a substrate depending on a material of a formed film and can form both a magnetic layer and a non-magnetic layer in the same chamber, and a method of manufacturing a magnetic device.

Means for Solving the Problems

The configuration of the present invention that has been made to achieve the above object is as follows.

That is, there is provided a sputtering apparatus that introduces process gas into a vacuum dischargeable chamber, applies a voltage to cathode units to generate plasma discharge between a substrate holder and the cathode units, sputters targets mounted in the cathode units, and forms a thin film on the processing surface of the substrate. The sputtering apparatus includes a substrate holder configured to support a substrate; magnet holders that are disposed around the substrate holder; magnets that are movably loaded on the magnet holders; supporting members that protrude from the substrate holder so as to face the magnets; connecting members that are disposed in the magnets and engaged with the supporting members; a rotation mechanism configured to rotationally move at least one of the substrate holder and the magnet holders; and a connection switching mechanism configured to move, when positions of the supporting members and the connecting members are matched to each other by rotational movement of the rotation mechanism, the substrate holder upward and downward to engage the supporting members and the connecting members with each other or separate the supporting members and the connecting members from each other, and switch whether or not to apply a magnetic field to the substrate.

Effects of the Invention

According to the present invention, when the positions of the supporting members and the connecting members are matched to each other by rotational movement of the rotation mechanism, the connection switching mechanism moves the substrate holder upward and downward to engage the supporting members and the connecting members with each other or separate the supporting members and the connecting members from each other, and switches whether or not to apply a magnetic field to the substrate. Accordingly, it can be switched whether or not to apply a magnetic field to the substrate depending on a material of a film to be formed, and a magnetic layer and a non-magnetic layer can be formed in the same chamber.

BRIEF DESCRIPTION OF THE DRAWINGS

FIG. 1 is a front cross-sectional view illustrating the case where a magnet is disposed at a waiting position in a sputtering apparatus according to a first embodiment.

FIG. 2 is a front cross-sectional view illustrating a state where a magnetic field is applied to a substrate and a film is formed, in the sputtering apparatus according to the first embodiment.

FIG. 3 is a front cross-sectional view illustrating a state where a film is formed without application of a magnetic field to a substrate, in the sputtering apparatus according to the first embodiment.

FIG. 4 is a plan view illustrating a state where a substrate holder supports an annular magnet.

FIG. 5 is a plan view illustrating a state where a substrate holder does not support an annular magnet.

FIG. 6 is an enlarged cross-sectional view illustrating an area C of FIG. 2.

FIG. 7 is a diagram illustrating a relationship between a magnetic field application direction at the time of forming a film with application of a magnetic field and a magnetic field application direction at the time of measuring a magnetic characteristic.

FIG. 8 is a diagram illustrating a film thickness distribution of a NiFe thin film in a surface.

FIG. 9 is a diagram illustrating a magnetic characteristic at the time of forming a film with application of a magnetic field using an MOKE measurement.

FIG. 10 is a diagram illustrating a magnetic characteristic at the time of forming a film without application of a magnetic field using an MOKE measurement.

FIG. 11 is a plan view illustrating a state where a substrate holder is disposed at a waiting position in a sputtering apparatus according to a second embodiment.

FIG. 12 is a plan view illustrating a state where a substrate holder is disposed at a connection position in the sputtering apparatus according to the second embodiment.

FIG. 13 is a plan view illustrating a configuration example of an apparatus for manufacturing a magnetic device.

FIG. 14 is a schematic cross-sectional view illustrating a tunnel magnetoresistance element that is formed using an apparatus for manufacturing a magnetic device according to a third embodiment.

DESCRIPTION OF REFERENCE NUMERALS

100, 200: sputtering apparatus
101: chamber
102: substrate holder
103: supporting member
104, 204: magnet
105: connecting member
106: magnet holder
107: target
108: power supply
109: gate valve
110: discharge system
111: valve
112: gas introducing system
113: cathode unit
114: carrying-in entrance
121: rotation mechanism
122: upward/downward driving mechanism
123: rotation shaft
125: magnetic field application direction at the time of forming a film with application of a magnetic field
126: magnetic field application direction at the time of measuring a magnetic characteristic (Easy axis)
127: magnetic field application direction at the time of measuring a magnetic characteristic (Hard axis)
129: notch
130: film thickness distribution of a NiFe thin film formed with application of a magnetic field
131: film thickness distribution of a NiFe thin film formed without application of a magnetic field
W: substrate
300: apparatus for manufacturing a magnetic device (tunnel magnetoresistance element)
310: vacuum carrying chamber
311: vacuum carrying mechanism
320A, B, C, and D: sputtering film forming chamber
330: gate valve
340: substrate pretreatment chamber
350: oxidation treatment chamber
360: load lock chamber

BEST MODE FOR CARRYING OUT THE INVENTION

Hereinafter, exemplary embodiments of the present invention will be described with reference to the accompanying drawings. However, the present invention is not limited to the exemplary embodiments.

First Embodiment

Referring to FIGS. 1 and 2, the entire configuration of a substrate processing apparatus according to a first embodiment of the present invention will be described. In this example, a sputtering apparatus will be described as an example of the substrate processing apparatus, but the present invention is not limited thereto. For example, the substrate processing apparatus may be a CVD apparatus, a molecular beam epitaxy (MBE) apparatus, or an etching apparatus.

FIG. 1 is a front cross-sectional view illustrating the case where a magnet is disposed at a waiting position in a sputtering apparatus according to the first embodiment. FIG. 2 is a front cross-sectional view illustrating a state where a magnetic field is applied to a substrate and a film is formed, in the sputtering apparatus according to the first embodiment. FIG. 3 is a front cross-sectional view illustrating a state where a film is formed without application of a magnetic field to a substrate, in the sputtering apparatus according to the first embodiment. FIG. 4 is a plan view illustrating a state where a substrate holder supports an annular magnet. FIG. 5 is a plan view illustrating a state where a substrate holder does not support an annular magnet. FIG. 6 is an enlarged cross-sectional view illustrating an area C of FIG. 2.

As shown in FIGS. 1 to 3, in this embodiment, a magnetron sputtering apparatus 1 is exemplified as an apparatus that forms a thin film on a processing substrate (wafer) W. The sputtering apparatus 1 according to this embodiment includes a vacuum dischargeable chamber 101 that divides a processing chamber. The chamber 101 includes a substrate holder 102 that serves as an anode electrode to support the substrate W, and a plurality of cathode electrodes (hereinafter, referred to as "cathode units") 113 that are disposed upward in an oblique direction with respect to the substrate W and support targets 107 on bottom surfaces thereof.

The chamber 101 is connected to a discharge system 110 through a gate valve 109, and the discharge valve 110 is connected to a discharge device, such as a discharge pump (not shown), which depressurizes the processing chamber in the chamber up to a predetermined vacuum degree. Further, an upper wall of the chamber 101 is connected to a gas introducing system 112 that includes a flow rate controller (not shown) or a valve 111, as an introducing unit of process gas, and the process gas is introduced from the gas introducing system 112 to the processing chamber with a predetermined flow rate.

Further, the upper wall of the chamber 101 is provided with the plurality of cathode units 113 that face the targets 107 with respect to the processing surface of the substrate W and support the targets 107, as described above. Each of the cathode units 113 is connected to a power supply 108 to apply a high voltage through a matching circuit, and can determine targets 107a and 107b to be used by selecting the energizing power supply 108. On a back surface of the target 107 of the cathode unit 113, a cathode magnet (not shown) that generates plasma with a high density is disposed.

Further, below the plurality of cathode units 113, a shutter that selectively opens and closes the front of each target 107 may be provided. Further, each cathode unit 113 may be provided such that a target surface is inclined to a substrate surface.

As a material of the target 107, a single composition material, such as tantalum (Ta) or copper (Cu), and a composite material made of two or more compositions, such as FeNiCo, may be used. Among the materials of the target, Ta or Cu is a non-magnetic material, but FeNiCo is a magnetic material. The film forming materials will be described in detail below.

The substrate holder 102 that is a placing base to support the substrate W serves as the anode electrode, as described above. The substrate holder 102 is configured to be connected to the rotation mechanism 121 and rotate around a rotation shaft 123, and rotates at the time of forming a film.

Annular magnets 104 that apply a magnetic field to the substrate W are provided around the substrate holder 102. In the annular magnets 104, a magnetic pole is set, such that the magnetic field is applied in one direction. The annular magnets 104 are movably loaded on the magnet holders 106.

As shown in FIGS. 4 and 5, in inner surfaces of the annular magnets 104, four connecting members 105 that face the substrate holders 102 (inward) and are equally disposed at four locations of a circumferential direction protrude. Meanwhile, in side surfaces of the substrate holder 102, similarly to the above case, four supporting members 103 that face the magnets 104 (outward) and are equally disposed at four locations of a circumferential direction protrude. That is, these supporting members 103 and connecting members 105 are equally disposed at an interval of 90 degrees in the circumferential direction. If the substrate holder 102 is rotated and moved by the rotation mechanism 121 and the rotation shaft 123, positions (angles) of the circumferential direction become matched to each other. The position of the supporting member 103 of the substrate holder 102 in a heightwise direction is set to be lower than that of the connecting member 105 of the magnet 104.

Further, the rotation shaft 123 of the substrate holder 102 includes a connection switching mechanism 122, such as a cylinder device, which can move in an upward/downward direction. The substrate holder 102 and the supporting member 103 are configured to move upward and downward by the connection switching mechanism 122. Accordingly, if the substrate holder 102 is lifted by the connection switching mechanism 122 in a state where the positions (angles) of the supporting member 103 and the connecting member 105 in the circumferential direction are made to be matched to each other, the annular magnet 104 is lifted from the magnet holder 106 through the connecting member 105. Meanwhile, if the connection switching mechanism 122 descends, the annular magnet 104 can be loaded on the magnet holder 106. That is, if the connection switching mechanism 122 is used, it is possible to switch whether or not to apply a magnetic field to the substrate W.

As shown in FIG. 6, on an abutment surface of the supporting member 103 and the connecting member 105, a counter boring portion 124 having an unevenness shape is formed as an engagement portion, in order to prevent slippage of both the supporting member 103 and the connecting member 105.

Further, the number and the arrangement angle of each of the supporting members 103 and the connecting members 105 is not limited. However, in the case of the annular magnet 104, three or more annular magnets are preferably provided.

In addition, a side wall of the chamber 101 is provided with a carrying-in entrance 114 that can be opened and closed to carry the substrate W on the substrate holder 102 by a carrying device, such as a robot arm (not shown).

Next, referring to FIGS. 1 to 10, a function of the sputtering apparatus 100 according to the first embodiment will be described, and a method of manufacturing a magnetic device according to the present invention will be described.

During sputtering in the sputtering apparatus 100 according to this embodiment, the process gas is introduced into the processing chamber of the chamber 100, power is selectively applied from the power supply 108 to the cathode unit 113, and a magnetic field is generated in the cathode unit 113 by the cathode magnet. Thereby, the sputtering apparatus 100 generates plasma discharge in the processing chamber and forms a thin film made of a target material on the substrate W. At this time, the sputtering apparatus 100 switches whether or not to apply a magnetic field to the substrate W depending on a material of the film.

First, a method of forming a film without applying a magnetic field to the substrate W will be described. In an initial state shown in FIG. 5, the positions of the supporting member 103 of the substrate holder 102 and the connecting member 105 of the annular magnet 104 are deviated from each other. The substrate holder 102 can move upward and downward without coming in contact with the magnet 104. In this state, the annular magnet 104 maintains a waiting state on the magnet holder 106. For this reason, as shown in FIG. 3, if the substrate holder 102 is lifted to a film formation position and a film is formed on the substrate while the substrate holder 102 is rotated, even though a magnetic field is not applied to the substrate W, a non-magnetic film can be formed through sputtering.

Next, a method of forming a film with application of a magnetic field to the substrate W will be described. When the film is formed with application of the magnetic field, after the substrate W is carried onto the substrate holder 102, the substrate holder 102 descends below the annular magnet 104 in order to support the magnet 104. In addition, as shown in FIG. 4, before the substrate holder 102 is lifted, the substrate holder 102 rotates by 45 degrees in a clockwise direction, until the position of the supporting member 103 of the substrate holder 102 is matched (overlapped) to the position of the connecting member 105 of the magnet 104.

Then, if the substrate holder 102 is lifted, as shown in FIG. 6, the supporting member 103 of the substrate holder 102 and the counter boring portion 124 of the connecting member 105 of the magnet 104 are engaged with each other. As a result, the substrate holder 102 can lift the magnet 104 without an angular deviation (positional deviation). Accordingly, as shown in FIG. 2, in a state where the substrate holder 102 and the magnet 104 rotate on the same rotation shaft 123 while a magnetic field is applied to the substrate W, a magnetic film can be formed with application of the magnetic field.

In FIG. 5, a rotational angle of the substrate holder 102 is changed, and the substrate holder 102 rotates by 125 degrees in a clockwise direction and lifts the magnet 104. As compared with the case where the substrate holder 102 rotates by 45 degrees in a clockwise direction and supports the magnet 104, an angle of 90 degrees can be changed and the magnetic field can be applied to the substrate W. In this sequence, it is possible to arbitrarily change an application direction of the magnetic field depending on the number or combination of each of the supporting members 103 and the connecting members 105.

Next, a description is given to a magnetic characteristic and a film thickness distribution of the NiFe thin film that is formed using the sputtering apparatus 100 according to this embodiment and the method of manufacturing a magnetic film device. FIG. 7 is a diagram illustrating a relationship between a magnetic field application direction at the time of forming a film with application of a magnetic field and a magnetic field application direction at the time of measuring a magnetic characteristic.

In FIG. 7, an arrow 125 indicates a magnetic field application direction, when the NiFe thin film is formed in the substrate W while a magnetic field is applied. In this case, the magnetic field is applied to the substrate W in a direction parallel to an applied notch 129. Arrows 126 and 127 indicate directions in which the magnetic field is applied when a magnetic characteristic is measured. The arrows 126 and 127 are orthogonal to each other. Here, for convenience of explanation, the arrow 126 that is parallel to the notches 129 and 125 is called an Easy axis, and the arrow 127 is called a Hard axis.

FIG. 8 is a diagram illustrating a film thickness distribution of a NiFe thin film in a surface, which displays in contour a film thickness of an 8-inch substrate in a surface. In FIG. 8, reference numeral 130 indicates a thickness of a NiFe thin film that is formed with application of the magnetic field, and reference numeral 131 indicates a thickness of a thin film that is formed without application of the magnetic field. The thin film 131 formed without application of the magnetic field has a concentric circle shape due to rotational film formation, but the thin film 130 has a shape where the film thickness is biased in one direction by an influence due to film formation with application of the magnetic field. As an index that is used to determine whether a film is formed such that the film thickness is uniform in the substrate surface, a percentage 1σ of a value obtained by dividing the standard deviation of the film thickness by an average value is used. The percentage 1σ of the film formed with application of the magnetic field becomes 0.8%, but the percentage 1σ of the film formed without application of the magnetic field becomes 0.1%, and it can be seen that a film thickness distribution is good. If the film is formed with application of the magnetic field, uniaxial magnetic anisotropy by crystal magnetic anisotropy is applied to the magnetic thin film.

FIG. 9 is a diagram illustrating a magnetic characteristic at the time of forming a film with application of a magnetic field using an MOKE measurement. FIG. 10 is a diagram illustrating a magnetic characteristic at the time of forming a film without application of a magnetic field using an MOKE measurement.

In FIGS. 9 and 10, a magnetic characteristic of the NiFe thin film is measured using MOKE (Magneto-Optic Kerr Effect). For example, the measurement principle of MOKE is disclosed in "Experiment Physic Lecture 6, Magnetism Measurement I", Keiichiro Kon, Hiroshi Yasuoka edition, Maruzen Tokyo, Feb. 15, 2000 by publication. In FIGS. 9 and 10, the Easy axis is denoted by a reference character E and the Hard axis is denoted by a reference character H.

FIG. 9 shows a magnetic characteristic of the NiFe thin film 120 that is formed with application of the magnetic field using the present invention. An anisotropy magnetic field H.sub.k that is calculated from a graph is 103.5 A/m (1.3 Oe) on the Easy axis but 326.3 A/m (4.1 Oe) on the Hard axis, and there is a difference in the anisotropy magnetic field $H_k$ Since a clear difference exists between magnetization curves, uniaxial anisotropy is applied Meanwhile, FIG. 10 shows a magnetic characteristic of the NiFe thin film 121 that is formed without application of the magnetic field using the present invention. The anisotropy magnetic field $H_k$ is almost the same on the Easy axis and the Hard axis as about 39.79 A/m (0.5 Oe), and magnetization curves are also almost the same. Therefore, the uniaxial anisotropy is not applied.

As described above, the substrate holder 102 and the magnet 104 are independently provided, and thus, the film formed with application of the magnetic field and the film formed without application of the magnetic field in the same reaction container 101 can be differentially used depending on a material of a multilayer film to be formed.

As described above, according to this embodiment, the positions of the supporting member 103 and the connecting member 105 can be matched with each other, by the rotational movement of the rotation mechanism 121. In this state, the connection switching mechanism 122 moves the substrate holder 102 upward and downward to engage the supporting member 103 and the connecting member 105 with each other or separate the supporting member 103 and the connecting member 105 from each other, and it is switched whether or not to apply the magnetic field to the substrate W. Accordingly, by the operation of the rotation mechanism 121 and the connection switching mechanism 122, it is possible to switch whether or not to apply the magnetic field to the substrate W depending on a material of a film to be formed, and it is possible to form both the magnetic layer and the non-magnetic layer in the same chamber 101. That is, the uniaxial anisotropy can be applied to the magnetic layer in one chamber 101 due to film formation with application of the magnetic field or a film in which a film thickness distribution is good due to film formation without application of the magnetic field can be formed, and an excellent thin film can be formed in accordance with a utilization object.

Second Embodiment

Referring to FIGS. 11 and 12, a sputtering apparatus according to a second embodiment of the present invention will be described. FIG. 11 is a plan view illustrating a state where a substrate holder is disposed at a waiting position in a sputtering apparatus according to the second embodiment. FIG. 12 is a plan view illustrating a state where a substrate holder is disposed at a connection position in the sputtering apparatus according to the second embodiment. In the following description, the same constituent members as those of the first embodiment are denoted by the same reference numerals.

As shown in FIGS. 11 and 12, in a sputtering apparatus 200 according to the second embodiment, two bar magnets 204, which have different polarities, are disposed with the substrate holder 102 interposed therebetween, thereby applying a magnetic field to the substrate W on the substrate holder 102 in one direction.

In inner surfaces of the bar magnet 204, connecting members 105 that face the substrate holder 102 (inward) and are respectively disposed at the centers of the bar magnet protrude. Meanwhile, in side surfaces of the substrate holder 102, similarly to the above case, two supporting members 103 that face the magnets 204 (outward) and are equally disposed at two locations of a circumferential direction protrude. That is, these supporting members 103 and connecting members 105 are configured as follows. If the substrate holder 102 is rotated and moved by the rotation mechanism 121 and the rotation shaft 123, a position (angle) of the substrate holder 102 in a circumferential direction is matched to a position of the connecting member 105 of the magnet 204. The position of the supporting member 103 of the substrate holder 102 in a heightwise direction is set to be lower than that of the connecting member 105 of the magnet 204.

Further, similarly to the first embodiment, on an abutment surface of the supporting member 103 and the connecting member 105, a counter boring portion having an unevenness shape is formed as an engagement portion 124, in order to prevent slippage of both the supporting member 103 and the connecting member 105 (see FIG. 6).

Further, the connecting member 105 protrudes from the magnet 204. However, when the supporting member 103 is inserted below the magnet 204, the engagement portion 124 may be formed on a bottom surface of the magnet 204 so as not to protrude the connecting member 105.

Further, similarly to the first embodiment, the substrate holder 102 includes a rotation mechanism 121 and a connection switching mechanism 122. That is, by using the rotation mechanism 121 and the connection switching mechanism 122, when the positions of the supporting member 103 and the connecting member 105 are matched to each other, the connection switching mechanism moves the substrate holder 102 upward and downward to engage the supporting member 103 and the connecting member 105 with each other or separate the supporting member 103 and the connecting member 105 from each other, and it can be switched whether or not to apply the magnetic field to the substrate.

The sputtering apparatus 200 according to the second embodiment can achieve basically the same function and effect as the first embodiment. In particular, according to the second embodiment, the apparatus configuration can be simplified and the magnetic field can be easily applied to the substrate W.

Third Embodiment

A third embodiment exemplifies the case where the sputtering apparatuses 100 and 200 according to the first and second embodiments are applied to an apparatus for manufacturing a magnetic device (tunnel magnetoresistance effect element). FIG. 13 is a plan view illustrating a configuration example of an apparatus for manufacturing a magnetic device.

As shown in FIG. 13, an apparatus 300 for manufacturing a magnetic device (tunnel magnetoresistance effect element) includes a vacuum carrying chamber 310 at the center. The vacuum carrying chamber 310 is provided with two vacuum carrying mechanisms 311 each of which is composed of a handling robot. The vacuum carrying chamber 310 is connected to four sputtering film forming chambers 320A, 320B, 320C, and 320D through a gate valve 330. Further, the vacuum carrying chamber 310 is connected to a substrate pretreatment chamber 340 to physically remove impurities on a processing surface of the substrate W and an oxidation treatment chamber 350 to subject a metal thin film to oxidation treatment through the gate valve 330. Furthermore, the vacuum carrying chamber 310 is connected to two load lock chambers 360 to take the substrate W in and out between a vacuum space and the air. All chambers except the load lock chamber 360 are vacuum chambers under a pressure of $2 \times 10^{-6}$ Pa or less, and the movement of the substrate W between the individual vacuum chambers is made in a vacuum, by means of the vacuum carrying mechanism 311.

The sputtering film forming chambers 320B and 320D are configured using the sputtering apparatuses 100 and 200 according to the first and second embodiments of the present invention. On upper walls of the sputtering film forming chambers 320B and 320D, five cathode units 113 are equally disposed in a circumferential direction. Further, on upper walls of the sputtering film forming chambers 320A and 320C, two cathode units 113 are disposed.

Next, a method of manufacturing a magnetic device according to the third embodiment will be described.

First, in order to form a spin valve tunnel magnetoresistance thin film, the substrate W is disposed in the load lock chamber 360 under an atmospheric pressure, the load lock chamber 360 is vacuum discharged, and then the substrate W is carried to a desired vacuum chamber by the vacuum carrying mechanism 311.

As an example, the case of manufacturing a bottom-type spin valve tunnel magnetoresistance thin film that has a laminated ferri stationary layer as a magnetization stationary layer to be described in detail below will be described.

FIG. 14 is a schematic cross-sectional view illustrating a tunnel magnetoresistance element that is formed using an apparatus for manufacturing a magnetic device according to the third embodiment. As shown in FIG. 14, the tunnel magnetoresistance element has the film configuration that includes a lower electrode layer 2, an antiferromagnetic layer 3, a magnetization stationary layer 4, a tunnel barrier layer 6, a magnetization free layer 7, and a protection layer 8, which are sequentially laminated in this order from the side of the substrate W. The lower electrode layer 2 has a laminated structure of Ta (5 nm)/CuN (20 nm)/Ta (3 nm)/CuN (20 nm)/Ta (3 nm). The antiferromagnetic layer 3 is a laminated ferri stationary layer composed of PtMn (15 nm), and the magnetization stationary layer 4 is a laminated ferri stationary layer composed of CoFe (2.5 nm) 4a/Ru (0.85 nm) 5/CoFeB (3 nm) 4b. In this case, CoFeB of 4b corresponds to a first ferromagnetic layer. The tunnel barrier layer 6 is composed of MgO (1.5 nm). The magnetization free layer 7 is composed of CoFeB (3 nm), and corresponds to a second ferromagnetic layer. As the protection layer 8, a laminated structure of Ta (8 nm)/Cu (30 nm)/Ta (5 nm)/Ru (7 nm) is used. In addition, a numerical value in parentheses indicates a film thickness.

In order to efficiently form the above-described film configuration, in each sputtering film forming chamber, the targets are disposed as follows. In the sputtering film forming chamber 320A, Ta (tantalum) and Cu (copper) are disposed. In the sputtering film forming chamber 320B, $Co_{70}Fe_{30}$ (cobalt-iron), PtMn (platinum-manganese), Ru (ruthenium), and $Co_{60}Fe_{20}B_{20}$ (cobalt-iron-boron) are disposed. In the sputtering film forming chamber 320C, Mg is disposed. In the sputtering film forming chamber 320D, Ta, $Co_{60}Fe_{20}B_{20}$, Mg, Ru, and Cu are disposed.

A sequence of forming the spin valve tunnel magnetoresistance thin film having the laminated ferri structure that is the most complicated film configuration will be described. First, the substrate W is carried to the substrate pretreatment chamber 340, and a portion (about 2 nm) of a surface layer contaminated in the atmosphere is physically removed by inverse sputter etching. Thereafter, the substrate W is carried to the sputtering film forming chamber 320A, and the lower electrode layer 2 composed of the laminated structure of Ta/CuN/Ta/CuN/Ta is formed. In this case, at the time of forming a film of CuN, a Cu target is used and a trace amount of nitrogen is added in addition to Ar as sputtering gas, thereby forming the film of CuN.

In the sputtering film forming chamber 320B, the antiferromagnetic layer 3 composed of PtMn and the magnetization stationary layer 4 (first ferromagnetic layer) composed of CoFe 4a/Ru 5/CoFeB 4b are formed. In this case, the present invention is embodied, and the magnetic layers of CoFe and CoFeB in the magnetization stationary layer 4 are formed with application of the magnetic field by installing the magnet 104 in the substrate holder 102 as shown in FIG. 2, and are magnetized in the same direction. In this manner, if uniaxial magnetic anisotropy is applied to the magnetic layer, a force that fixes magnetization becomes stronger, and an element characteristic is stabilized.

Meanwhile, the non-magnetic layers of PtMn of the antiferromagnetic layer 3 and Ru in the magnetization stationary layer 4 are formed in a state where the magnet 104 maintains a waiting state on the magnet holder 106, as shown in FIG. 3. As a result, it is possible to improve a film thickness distribution. In particular, Ru needs to have a film thickness making it possible to realize antiferromagnetic coupling between CoFe and CoFeB by means of an RKKY interaction, and a precision of 0.1 nm is needed. Therefore, it is necessary to form a uniform film in the substrate surface.

Further, the PtMn layer that serves as the antiferromagnetic layer 3 is formed by adjusting composition and film formation conditions (a kind and a pressure of gas, and applied power) of the targets to achieve regularization by annealing and develop an antiferromagnetic property and making the content of Pt fall in the range of 47 to 51 (at %). However, IrMn (iridium-manganese) may be used instead of PtMn. In this case, the Ru layer is preferably used as a base layer of the IrMn layer. At this time, the film configuration of the antiferromagnetic layer 3 becomes Ru/IrMn.

Next, in the sputtering film forming chamber 320C, as the tunnel barrier layer 6, an oxide film is directly formed using RF magnetron sputtering using an oxide target. As the oxide target, MgO (magnesium oxide), $Al_2O_3$ (aluminum oxide), and $TiO_2$ (titanium oxide) are used. In regards to MgO, the single crystal structure where a (100) crystal face is oriented to be parallel to a film surface or the multicrystal structure having various crystal components are preferable. Further, the tunnel barrier layer may be formed by forming a metal film becoming a precursor by DC magnetron sputtering and then oxidizing the metal film in the oxidation treatment chamber 26.

In the sputtering film forming chamber 320D, the magnetization free layer 7 (second ferromagnetic layer) of CoFeB, Ta of the Cap layer, and the upper electrode layer composed of the laminated structure of Cu/Ta/Ru are formed. Similarly to the magnetization stationary layer, the film of CoFeB is also formed with application of the magnetic field, and uniaxial magnetic anisotropy is applied. In addition, since the Cap layer and the upper electrode layer do not need the magnetic field, the films are formed without application of the magnetic field.

As the magnetic free layer 7, the single-layered structure of CoFeB, the two-layered structure of CoFeB and NiFe, and the two-layered structure of CoFe and NiFe are used. Further, the three-layered structure of CoFeB, Ru, and CoFeB, the three-layered structure of CoFeB, Ru, and NiFe, the three-layered structure of CoFe, Ru, and NiFe, the four-layered structure of CoFeB, CoFe, Ru, and CoFe, and the four-layered structure of CoFeB, CoFe, Ru, and NiFe are used.

The sputtering apparatus 200 according to the second embodiment can achieve basically the same function and effect as the first embodiment. In particular, according to the third embodiment, the plurality of chambers are connected through the gate valves 330 in a state where a vacuum degree is maintained. In addition, the substrate W is carried between the individual chambers, thereby continuously manufacturing the magnetic devices.

The preferred embodiments of the present invention have been described. However, the preferred embodiments are only exemplified to describe the present invention, and do not limit the scope of the present invention. The present invention can be embodied in various aspects different from the above-described embodiments, within the scope that does not depart from the spirit of the present invention.

For example, the rotation mechanism 121 is provided only in the substrate holder 102, but the present invention is not limited thereto. Separately from the rotation mechanism 121 provided in the substrate holder 102, a rotation mechanism may be provided in the magnet holder 106. That is, if at least one of the substrate holder 102 and the magnet holder 106 is rotated and moved, the positions of the supporting member 103 and the connecting member 105 can be matched to each other due to the rotational movement.

INDUSTRIAL APPLICABILITY

The present invention can be applied to plasma treatment apparatuses such as a dry etching apparatus, a plasma asher apparatus, a CVD apparatus, and a liquid crystal display manufacturing apparatus as well as the exemplified magnetron sputtering apparatus.

The invention claimed is:

1. A substrate processing apparatus comprising:
a substrate holder configured to support a substrate;
a magnet holder that is disposed around the substrate holder;
a magnet that is movably loaded on the magnet holder;
a supporting member that protrudes from the substrate holder so as to face the magnet;
a connecting member that is disposed in the magnet and engaged with the supporting member;
a rotation mechanism configured to rotationally move around a rotation shaft of the substrate holder at least one of the substrate holder and the magnet holder; and
a connection switching mechanism configured to move, when positions of the supporting member and the connecting member are matched to each other by rotational movement of the rotation mechanism, the substrate holder upward and downward to engage the supporting member and the connecting member with each other or separate the supporting member and the connecting member from each other, and switch whether or not to apply a magnetic field to the substrate.

2. The substrate processing apparatus according to claim 1, wherein engagement portions each having an uneven shape are formed on abutting surfaces of the supporting member and the connecting member.

3. The substrate processing apparatus according to claim 1, wherein the magnet is an annular magnet, which makes one ring around the rotation shaft of the substrate holder, or a bar magnet.

4. An apparatus for manufacturing a magnetic device, including a sputtering apparatus which comprises:
a substrate holder configured to support a substrate;

a magnet holder that is disposed around the substrate holder;

a magnet that is movably loaded on the magnet holder;

a supporting member that protrudes from the substrate holder so as to face the magnet;

a connecting member that is disposed in the magnet and engaged with the supporting member;

a rotation mechanism configured to rotationally move around a rotation shaft of the substrate holder at least one of the substrate holder and the magnet holder;

a connection switching mechanism configured to move, when positions of the supporting member and the connecting member are matched to each other by rotational movement of the rotation mechanism, the substrate holder upward and downward to engage the supporting member and the connecting member with each other or separate the supporting member and the connecting member from each other, and switch whether or not to apply a magnetic field to the substrate; and a cathode unit, wherein the sputtering apparatus is connected to a load lock chamber configured to take the substrate in and out between a vacuum space and the air, through a vacuum carrying chamber configured to include a vacuum carrying mechanism.

* * * * *